Sept. 17, 1963 G. L. MATTHAEI 3,104,362

MICROWAVE FILTER

Filed Aug. 27, 1959 2 Sheets-Sheet 1

GEORGE L. MATTHAEI
INVENTOR.

BY David P. Ogle
Morris Spector
ATTORNEYS

Sept. 17, 1963 G. L. MATTHAEI 3,104,362

MICROWAVE FILTER

Filed Aug. 27, 1959 2 Sheets-Sheet 2

GEORGE L. MATTHAEI
INVENTOR.

BY David P. Ogden
Morris Spector
ATTORNEYS

United States Patent Office 3,104,362

Patented Sept. 17, 1963

3,104,362

MICROWAVE FILTER

George L. Matthaei, Menlo Park, Calif., assignor to Thompson Ramo Wooldridge Inc., Los Angeles Calif., a corporation of Ohio Filed Aug. 27, 1959, Ser. No. 836,366

9 Claims. (Cl. 333—73)

The present invention relates to a microwave band-pass filter, and particularly to the type of filter utilizing resonators of the quarter wavelength direct and distributed coupled type arranged in either printed circuit or bar strip transmission line construction.

Strip transmission line band-pass filters are known which comprise a plurality of resonator assemblies disposed between two parallel conductive ground plates. The resonator assemblies usually include a conductive element having a length which is an appreciable fraction of a wavelength of the mid-frequency of a desired pass-band. Often the length of the conductor is approximately one-half wavelength at the pass band center frequency whereby the filter itself is quite bulky. Usually the resonators are coupled by series capacitive gaps. One of the problems resulting from the use of one-half wavelength resonators with series capacitive couplings is that the maximum attenuation above the pass-band is often lower than might be desired when the pass-band width is an appreciable fraction of the mid-frequency of the filter pass-band. Moreover, with the one-half wavelength resonator conductors, the second pass-band occurs at twice the first pass-band frequency so that low order harmonics may not be rejected.

Previous work indicates that direct-coupled, one-quarter wavelength resonator elements with couplings at each end provide certain advantages over analogous direct-coupled one-half wavelength resonators. These advantages include reduction by often more than 50% in the length of the resonator assembly and the second pass-band being centered at three times the frequency of the primary pass-band whereby lower order harmonics are more completely rejected.

For the type of filter with quarter wavelength resonators discussed herein, the assembly length is reduced to around 25% of the length of other filters with quarter wavelength resonators, as a result of the overlapping of adjacent resonators. Moreover, the attenuation band above the primary pass-band is stronger due to the looser couplings required for a given pass band width, and filters utilizing resonator elements having an effective length of one-quarter wavelength of the mid-frequency can be conveniently designed for greater bandwidths. Similarly, the use of parallel distributed couplings between resonator elements provides a practical advantage of greater spacing between the elements than a more conventional end-to-end direct capacitively coupled system wherein the spacing tolerance between the ends must be more precisely controlled. With such de-emphasis of the coupling gap, it becomes more feasible to produce band-pass filters wherein the tolerances of the spacing between the resonator conductors are not as restrictive and simplified construction techniques, such as printed circuits, may be used.

Therefore an object of the present invention is to provide a simple and reliable resonator designed to take advantage of the one-quarter wavelength resonator characteristics and the parallel distributed coupling characteristics.

Briefly, in accordance with one embodiment of this invention, a multi-resonator filter assembly includes a plurality of substantially one-quarter wavelength resonator elements which are alternatively coupled by a lumped inductance coupling and a distributed capacitive coupling. The resonator elements may have steps in their width to aid in designing for specific response characteristics. The arrangement and size of the couplings, combined with the dimensions of the resonator elements themselves, determines a predictable band-pass characteristic.

The invention is described in greater detail in the accompanying drawings wherein like numerals refer to similar parts and wherein.

Figure 1:
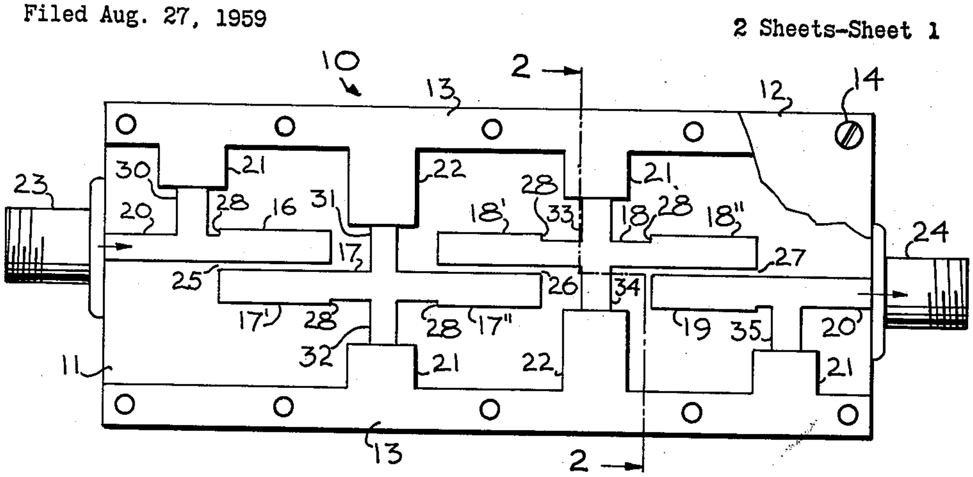
FIG. 1 is a top plan view, partially cut away, of a first embodiment of a six resonator filter assembly illustrating one form of the present invention.
Figure 2:
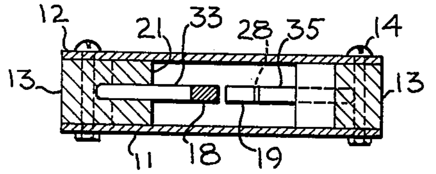
FIG. 2 is a cross-sectional view taken along the line 2—2 of the embodiment shown in FIG. 1.

Referring now to FIGS. 1 and 2, a strip transmission line filter assembly 10 includes a pair of parallel elongated metal ground plates 11 and 12 which are spaced apart by and secured to a pair of similar metal side bars 13 by a plurality of bolts 14. In FIG. 1 the upper ground plate 12 has been partially cut away to show the bar conductors 16, 17, 18 and 19 and the input-output lines 20. The metal side bars 13 are formed with inwardly projecting short-circuiting blocks 21 and 22 which are longitudinally spaced to support the bar conductors. Because of the parallel coupling array, the blocks 22 are somewhat longer than the blocks 21 to support the bar conductors in an overlapping arrangement. With the construction illustrated in FIG. 1 the bar conductors 17 and 18 are slightly less than one-half wavelength of the mid-pass-band frequency of the filter and along with bars 16 and 19 function as six one-quarter wavelength resonator elements 16, 17′, 17″, 18′, 18″ and 19, whereby each of the conductors 17 and 18 functions as a pair of one-quarter wavelength resonators. The resonator elements 16 and 19 are inductively coupled and partially supported by the lines 20 connected to an input connector 23 and an output connector 24 respectively.

Between the resonator elements 16 through 19 are provided parallel gap distributed capactive couplings 25, 26 and 27 having a longitudinal length of overlap extending over a major portion of the one-quarter wavelength resonator elements 16, 17′, 17″, 18′, 18″ and 19. In one specific filter embodying this invention, the coupling gap 25 between the resonator elements 16 and 17′ is a substantial portion of the length of the resonator elements and has a gap spacing on the order of .037″. The particular length of overlap used is more than one-half of the length of the one-quarter wave resonator elements and this provides appreciable distribution of the capacitive coupling. Because of the gap length and the distributed capacitance thereof, the mechanical tolerances of the capacitive gap spacings are not as critical as for a direct capacitive coupling between the end surfaces of resonator elements disposed in a linear array. In other words, because of the increased length of the gap, a proper gapping is obtained with a greater spacing between the resonator elements and a .001 inch manufacturing error will not cause as great a change in the capacitance of the coupling. For one specific design, when the gap 25 is .037″ the gap 26 between the resonator elements 17″ and 18′ is of the order of .048″ and the gap 27 between the resonator elements 18″ and 19 is of the order .037". Proper selection of gap spacing facilitates the obtaining of a desired pass-band.

Also shown in FIG. 1 is a discontinuity 28 in the resonator elements adjacent to the end of a resonator coupled thereto. Such a discontinuity is a function of distributed coupling between adjacent resonator elements and between elements and the ground plates. Proper design may require the addition or deletion of as much as 20% of the lateral thickness of the resonator elements 16 through 19.

In accordance with the present invention, the strip line filter illustrated is also provided with lumped shunt inductive couplings comprising the short arms or stubs 30, 31, 32, 33, 34 and 35, between the blocks 21 and 22 and each bar conductor, which serve an additional function of supporting the resonator elements 16 to 19. The shunt inductive couplings or stubs 31—34 are approximately at the longitudinal center of the one-half wavelength bar conductors and the stubs 30—35 are at one end of each of the one-quarter wavelength resonator elements 16 and 19. The stubs 30—35 are substantially shorter than one-quarter wavelength.

The provision of the support bars or stubs 30—35 which function as lumped inductive shunt couplings at approximately one-quarter wavelength from each end of the one-half wavelength bar conductors and the parallel distributed capacitive coupling area between overlapping resonator elements produces band-pass characteristics in which the one-quarter wavelength resonator elements are dominant. The overall result is that the one-half wavelength bar conductor is in effect two one-quarter wavelength resonator elements inductively coupled at one end and capacitively coupled therebetween.

As shown in FIG. 2 the side bars 13 may be split to provide a plurality of slots in the plane of the resonator elements so that the outer ends of each of the inductive stubs 30—35 may be clamped between the upper and lower halves of the side bars, thus insuring a proper parallel support of the bar conductors 16—19.

It should be noted that with the above construction the resonator elements are effectively approximately 4% longer than their physical measurement. In other words, the particular arrangement illustrated provides a characteristic of a slightly lower frequency than would be indicated by simply measuring one of the resonator elements. Thus FIGS. 1 and 2 illustrate one embodiment of the present invention.

Alternatively, the resonator elements may be formed by photo-etching of copper foil attached to a dielectric support sheet. Since the mechanical tolerances of the filter construction according to the present invention are not as critical as direct capacitive couplings of a linear array, the manufacture of this strip transmission filter line by printed circuit techniques is very attractive.

Figure 3:
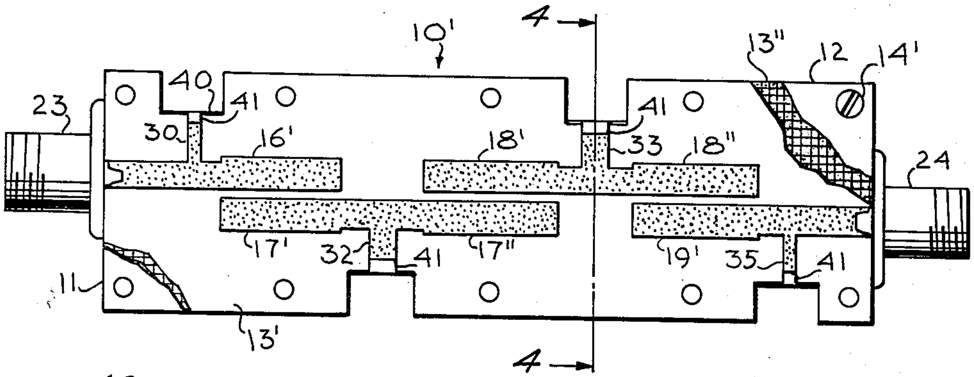
FIG. 3 is a plan view, partially cut away, of another embodiment of a six resonator filter assembly.
Figure 4:
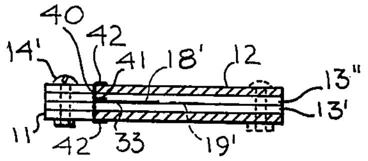
FIG. 4 is a cross-sectional view taken along the line 4—4 of the embodiment shown in FIG. 3.

Such a resonator assembly is shown in FIGS. 3 and 4 wherein a lower ground plate 11 is secured to one surface of a dielectric support plate 13' and the resonator elements 16' through 19' are formed by etching on the top surface of the dielectric support member or plate 13'. A second ground plate 12 is secured to the upper surface of a second dielectric support plate 13". The upper ground plate 12 and its supporting dielectric plate 13" are partially cut away in FIG. 3 to illustrate the filter assembly. With the fabrication of filter assembly according to printed circuit techniques it is not necessary to utilize metal side bars (13 in FIG. 1).

Iin FIGS. 3 and 4 each of the ground plates 11 and 12 is connected to the other ground plate in the region of the ends of the stubs 30, 32, 33, 35 by electric circuit means such as a shunting foil or grounding strap 40 having a tab 41 which contacts electrically the outer ends of each stub. In the arrangement shown the stubs 31 and 34 have been omitted as may be desirable in some cases where the pass band is quite wide, such as a pass band equal to 40 percent or more of the mid-pass-band frequency. When such construction is used, proper inductive susceptance is obtained by making the end stubs 30 and 35 somewhat narrower and longer to decrease the inductive effect at the ends proportionately. The omission of the stubs 31 and 34 allows an increased compactness of structure because the resonator elements 16' and 18', 17" and 19' may be more closely associated without increased losses resulting from a coupling between the ends of the resonator element and the stub members. This omission of the stubs 31 and 34 is also feasible in a filter assembly using bar conductors.

After the resonator elements 16' through 19' have been formed on plate 13' by etching, the tabs 41 are positioned to engage the stubs 30, 32, 33 and 35 and the top ground plate 12 is positioned thereover. After the entire assembly is secured as an integral unit by a plurality of securing means, such as the bolts 14', the extreme upper and lower end portions 42 of the shunting foil 40 may then be folded over the ground plates 11 and 12 and secured thereto. It will be noted that the bolts 14' are positioned more distant from the resonator elements 16'—19' than the grounding straps 40.

Design theory for the above-described filter assembly shows that the electrical lengths of the resonator elements 16'—19' (from one end to the center of the region of the inductive coupling) should be slightly less than one-quarter wavelength of the mid-frequency of the pass-band. For example, in filters having a pass-band of a bandwidth of 5% or less of the mid-frequency, the resonator lengths are very nearly one-quarter wavelength. For greater bandwidths, such as 25% or more of the mid-frequency of the pass-band, the resonator elements are substantially less than one-quarter wavelength. Though the examples in FIGS. 1 and 3 show six resonator filters, any number of resonators may be used. Of course, for a given pass band width, the more resonators that are used, the stronger the stop band attenuation will be, and the wider the pass band width, the more resonators will be required to achieve a given rate of cutoff.

One of the advantages of this filter construction using overlapping one-quarter wavelength resonators is the appreciable reduction in size as compared to a linear array. Another advantage resulting from his construction when using bar conductors is that the resonator elements may be self-supporting, thus eliminating losses due to dielectric support material. Except for rather low microwave frequencies on the order of 1000 megacycles or below, dielectric supports may be completely eliminated when solid bar type construction is employed. Moreover, the distributed capacitive gaps between the parallel conductors, as above-mentioned, are less critical whereby printed circuit techniques are feasible.

Figure 5:
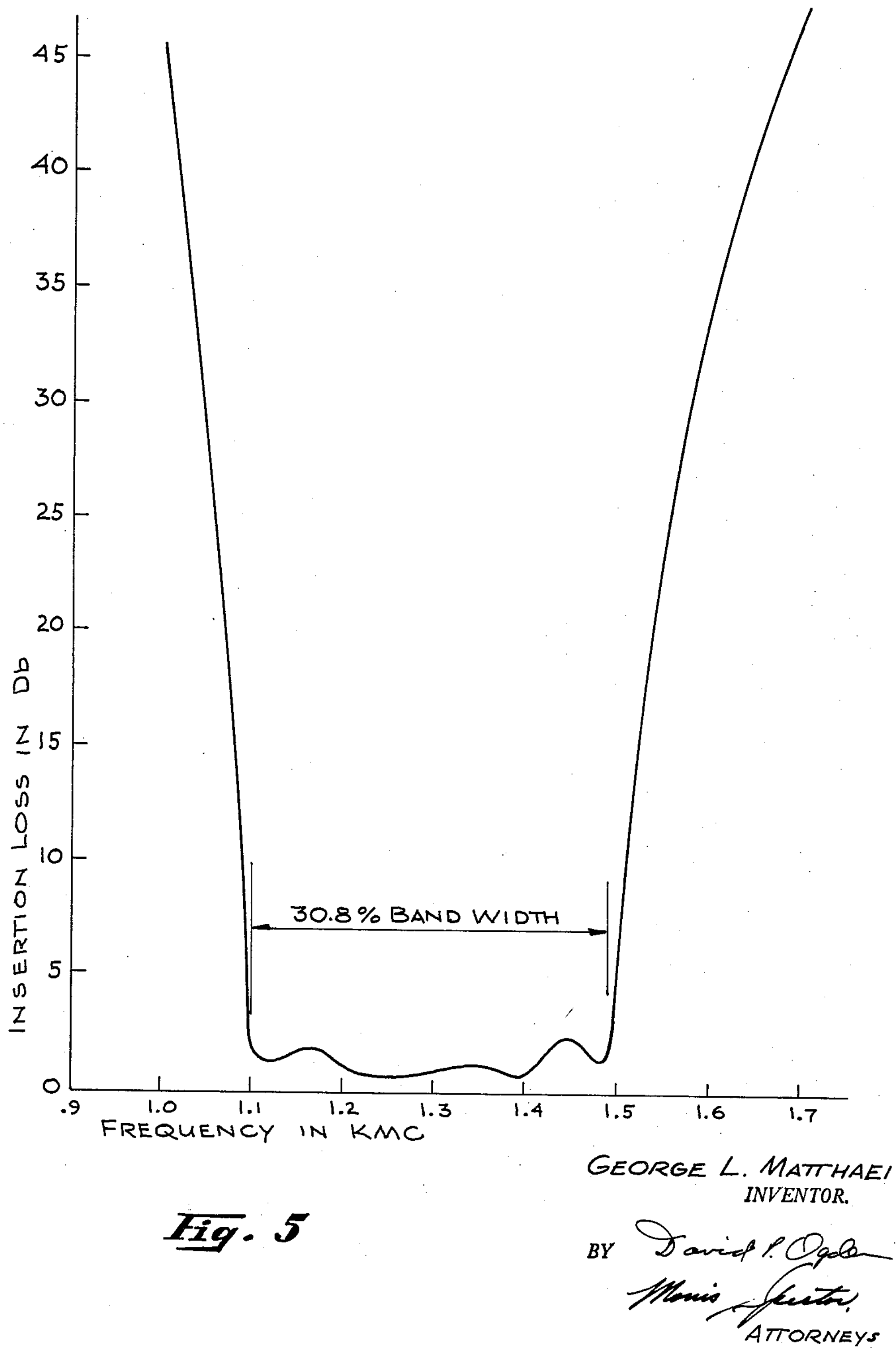
FIG. 5 is a curve illustrating the band-pass characteristic of a particular resonator assembly constructed according to the present invention.

Additional advantages become evident from the graph of FIG. 5 wherein the scale of the ordinates is the insertion loss in decibels (db) and the scale of the abscissae is frequency. FIG. 5 shows a band-pass characteristic of one six-resonator, printed circuit filter designed according to the above description. With this particular filter the passband is approximately 31% of the mid-frequency of the pass-band and the pass-band insertion loss is 2 db or less. A printed circuit filter with the more common half wavelength resonators having capacitive coupling at their ends would be difficult to build so as to have a bandwidth this wide. Moreover, the slope of the insertion losses both between the lower stop-band and the pass-band and between the pass-band and the upper stop-band is surprisingly sharp for a filter of this bandwidth having only six resonators. The relatively strong stop band attenuation of filters of this type is due partly to the relatively loose couplings required with quarter wavelength resonators. Also, the use of shunt inductive couplings alternately with distributed couplings which act predominantly as distributed series capacitors results in an extremely strong attenuating power at frequencies below the pass band.

While there are shown and described particular embodiments of this invention, other modifications may occur to those skilled in the art. It is intended therefore that the appended claims encompass all modifications which embody the true spirit and scope of the present invention.

I claim:

1. A band-pass microwave strip transmission line filter having a predetermined mid-pass-band frequency and comprising: a plurality of elongated conductors each arranged in a spaced-apart but overlapping adjacency with another of said conductors with the overlapping portions defining a distributed capacitive coupling therebetween; a ground member disposed in a spaced-apart adjacency with said conductors; and an elongated inductive connection between said ground member and each of said conductors at a point on the order of one-quarter wavelength of said mid-pass-band frequency from each end of said conductors, thereby providing band-pass filter resonator elements of the one-quarter wavelength type wherein each resonator element has one end inductively coupled by said connections and the region of the other end capacitively coupled by said overlapping portions, said inductive connections having a physical length that is appreciably less than the length of said resonator elements; said capacitive coupling being a major portion of the length of said resonator elements.

2. A band-pass microwave strip transmission line filter having a predetermined mid-pass-band frequency and comprising: a plurality of elongated bar conductors each arranged in a spaced-apart but overlapping adjacency with another of said conductors with the overlapping portions defining a distributed capacitive coupling therebetween; a pair of parallel ground members disposed in a spaced-apart adjacency with said conductors; a pair of side members secured between said pair of ground members; and an elongated inductive connection between said ground member and each of said bar conductors secured to said bar conductors at a point on the order of one-quarter wavelength of said mid-pass-band frequency from each end of said bar conductors, thereby providing band-pass filter resonator elements of the one-quarter wavelength type wherein each resonator element has one end inductively coupled by said connections and the region of the other end capacitively coupled by said overlapping portions, said inductive connections having a physical length that is appreciably less than the length of said resonator elements; said capacitive coupling being an appreciable portion of the length of said resonator elements; said side members clampingly engaging each of said connections for supporting said bar conductors.

3. A band-pass microwave strip transmission line filter having a predetermined mid-pass-band frequency and comprising: a plurality of elongated bar conductors each arranged in a spaced-apart but overlapping adjacency with another of said bar conductors with the laterally overlapping portions defining a distributed capacitive coupling therebetween; a pair of parallel ground members disposed in a spaced-apart adjacency with said bar conductors; a pair of metal side bars secured between said pair of ground members; said side bars each being inwardly projecting blocks with longitudinally adjacent blocks being of different lengths as a function of the lateral dimension of said bar conductors plus the spacing of the gap between the overlapping portions thereof; and an elongated inductive connection between said blocks and each of said bar conductors at a point on the order of one-quarter wavelength of said mid-frequency from each end of said bar conductors, thereby providing support means for said bar conductors and providing band-pass filter resonator elements of the one-quarter wavelength type in the region of each overlapping portion, with each of said resonator elements having one end inductively coupled by said inductive connections and having the region of the other end capacitively coupled by said overlapping portions, said inductive connections each having a physical length that is appreciably less than the length of said resonator elements, and each being parallel to said pair of ground members and perpendicular to said bar conductor supported thereby; said capacitive coupling being an appreciable portion of the length of said resonator elements.

4. A band-pass microwave strip transmission line filter having a predetermined mid-pass-band frequency and comprising: a first dielectric support member; a plurality of elongated conductors each arranged on one surface of said first member in a spaced-apart but overlapping adjacency with another of said conductors with the overlapping portions defining a distributed capacitive coupling therebetween; a ground member disposed on a surface of said first support member parallel to and spaced-apart from said one surface; an elongated inductive connection positioned at the center and perpendicular to each of said conductors with the length from the center line of said inductive connections to each end of said conductors being on the order of one-quarter wavelength of said mid-pass-band frequency, thereby providing one-quarter wavelength band-pass filter resonator elements, said inductive connection having a physical length that is substantially less than the length of said elements; a second dielectric support member secured over said conductors; a second ground member secured to a surface spaced-apart from and parallel to said one surface; and short-circuiting strips connected between the end of each of said inductive connections remote from said conductors and each of said ground members; said capacitive coupling being a major portion of the length of said elements.

5. A band-pass microwave strip transmission line filter having a predetermined mid-frequency comprising: a first dielectric support member; a plurality of elongated conductors each arranged on one surface of said first member in a spaced-apart but overlapping adjacency with another of said conductors with the overlapping portions defining a distributed capacitive coupling therebetween; a ground member disposed on a surface of said first support member parallel to and spaced-apart from said one surface; an elongated inductive connection positioned at the center and perpendicular to each of said conductors with the length from the center line of said inductive connections to each end of said conductors being on the order of one-quarter wavelength of said mid-pass-band frequency, thereby providing one-quarter wavelength band-pass filter resonator elements, said inductive connection having a physical length that is substantially less than the length of said elements; a second dielectric support member secured over said conductors; a second ground member secured to said second support member on a surface spaced-apart from and parallel to said one surface; and grounding strips connected between the end of each of said inductive connections remote from said conductors and each of said ground members; said capacitive coupling being a major portion of the length of said elements; the gap spacing of the overlapping portions of one pair of capacitively coupled elements being different from the spacing of the overlapping portion of another pair of capacitively coupled elements.

6. A band-pass microwave strip transmission line filter having a predetermined mid-pass-band frequency and comprising: a pair of parallel ground plates; a plurality of elongated conductors each arranged between said ground plates in a planar spaced-apart but over-lapping adjacency with another of said conductors with the laterally overlapping portions defining a distributed capacitive coupling therebetween; the lateral spacing in one region of overlapping adjacency being different from the lateral spacing in another region of overlapping adjacency; and an elongated inductive connection between each of said pair of ground plates and each of said conductors at a point on the order of one-quarter wavelength of said mid-pass-band frequency from each end of said conductors, thereby providing band-pass filter resonator elements of the one-quarter wavelength type in the region of each overlapping portion, with each of said resonator elements having one end inductively coupled by said inductive connections and having the region of the other end capacitively coupled by said overlapping portions; said inductive connections each having a physical length that is substantially less than the length of said one-quarter wavelength resonator elements, and each being parallel to said pair of ground plates and perpendicular to said conductor connected thereby; said capacitive coupling being more than one-half of the length of said resonator elements.

7. A band-pass microwave strip transmission line filter having a predetermined mid-pass-band frequency and comprising: a first dielectric support member; a plurality of elongated conductors each arranged on one surface of said first member in a spaced-apart but overlapping adjacency with another of said conductors with the overlapping portions defining a distributed capacitive coupling therebetween; a ground member disposed on a surface of said first support member parallel to and spaced-apart from said one surface; an elongated inductive connection positioned at the center and perpendicular to each of said conductors with the length from the center line of said inductive connections to each end of said conductors being on the order of one-quarter wavelength of said mid-frequency, thereby providing one-quarter wavelength band-pass filter resonator elements, said inductive connections having a physical length that is substantially less than the length of one-quarter wavelength of said mid-frequency; a second dielectric support member secured over said conductors; a second ground member secured to said second support member on a surface spaced-apart from and parallel to said one surface; grounding straps connected between the end of each of said inductive connections remote from said conductors and each of said ground members; said capacitive coupling being more than one-half of the length of said elements; the gap spacing of the overlapping portions of one pair of capacitively coupled elements being different from the gap spacing of the overlapping portion of another pair of capacitively coupled elements; and securing means for maintaining said first ground plate parallel to and adjacent to said second ground plate, said securing means being arranged relative to said conductors in a manner preventing substantial coupling therebetween.

8. A band-pass microwave strip transmission line filter having a predetermined mid-frequency comprising: a pair of parallel spaced-apart ground members; a plurality of elongated conductors each arranged in a plane between and spaced from said pair thereby defining a capacitive coupling therewith, each of said conductors being in a spaced-apart but overlapping adjacency with another of said conductors with the overlapping portions defining a distributed capacitive coupling therebetween; a plurality of elongated inductive stubs each positioned in said plane, perpendicular to and with one end electrically connected to the center of each of said conductors with the length from the center line of said inductive stubs to each end of said conductors being on the order of one-quarter wavelength of said mid-frequency, thereby providing one-quarter wavelength band-pass filter resonator elements, said inductive stubs having a physical length that is appreciably less than the length of said elements; grounding straps connected between the other end of each of said inductive stubs and each of said ground members; said capacitive coupling being substantially more than one-half of the length of said elements; the gap spacing of the overlapping portions of one pair of capacitively coupled elements being different from the gap spacing of the overlapping portion of another pair of capacitively coupled elements; securing means for maintaining one of said ground members parallel to the other of said ground members, said means being arranged relative to said conductors in a manner preventing substantial coupling therebetween; an input coupling member inductively coupled to a first of said elements; and an output coupling member inductively coupled to another of said elements.

9. A band-pass microwave strip transmission line filter having a predetermined mid-pass-band frequency and comprising: a pair of parallel spaced-apart ground members; a pair of spaced-apart metal side bars secured between and electrically connecting said pair of ground members; a plurality of elongated bar conductors each arranged in a plane between and spaced from said pair of ground members, thereby defining a capacitive coupling therewith, each of said conductors being in a spaced-apart but overlapping adjacency with another of said conductors with the overlapping portions defining a distributed capacitive coupling therebetween, each of said conductors being between said pair of side bars; a plurality of elongated inductive stubs each positioned in said plane, perpendicular to and with one end electrically connected to the center of each of said conductors with the length from the center line of said inductive stubs to each end of said conductors being on the order of one-quarter wavelength of said mid-frequency, thereby providing one-quarter wavelength band-pass filter resonator elements, said inductive connections having a physical length that is appreciably less than the length of said elements; said side bars each having a plurality of inwardly projecting blocks engaging the other end of each of said inductive stubs, said blocks and said other ends of said inductive stubs defining mating support surfaces; said capacitive coupling being substantially more than one-half of the length of said elements; the gap spacing of the overlapping portions of one pair of capacitively coupled elements being different from the gap spacing of the overlapping portion of another pair of capacitively coupled elements; securing means for maintaining said first ground plate parallel to and adjacent to said second ground plate, said means being arranged relative to said conductors in a manner preventing substantial coupling therebetween; an input coupling member inductively coupled to, and mechanically supporting a first of said elements; and an output coupling member inductively coupled to and supporting another of said elements.

References Cited in the file of this patent

UNITED STATES PATENTS

| | | |
|---|---|---|
| 2,859,417 | Arditi | Nov. 4, 1958 |
| 2,913,686 | Fubini | Nov. 17, 1959 |
| 2,915,716 | Hattersley | Dec. 1, 1959 |
| 2,937,347 | Matthaei | May 17, 1960 |
| 2,945,195 | Matthaei | July 12, 1960 |

OTHER REFERENCES

Sanders: "Handbook of Tri-Plate Microwave Components," copyright Dec. 31, 1956, by Sanders Associates (pages 91–93 relied upon primarily).